United States Patent
Patten et al.

(10) Patent No.: US 8,678,040 B2
(45) Date of Patent: Mar. 25, 2014

(54) VERTICALLY COMPACTABLE FLUID TRANSFER DEVICE

(75) Inventors: James W. Patten, Sandy, UT (US); Hamidreza Ghorbani, Mississauga (CA); Kyle Chomyn, Mississauga (CA)

(73) Assignee: Red Leaf Resources, Inc, South Jordan, UT (US)

( * ) Notice: Subject to any disclaimer, the term of this patent is extended or adjusted under 35 U.S.C. 154(b) by 42 days.

(21) Appl. No.: 13/587,576

(22) Filed: Aug. 16, 2012

(65) Prior Publication Data

US 2013/0206270 A1  Aug. 15, 2013

Related U.S. Application Data

(60) Provisional application No. 61/524,142, filed on Aug. 16, 2011.

(51) Int. Cl.
*F16L 11/00* (2006.01)

(52) U.S. Cl.
USPC ........................ 138/118; 138/121; 165/104.19

(58) Field of Classification Search
USPC .............. 138/118, 119, 121, 122; 165/104.19
See application file for complete search history.

(56) References Cited

U.S. PATENT DOCUMENTS

| | | | |
|---|---|---|---|
| 3,001,776 A | 4/1959 | Poollen | |
| 3,871,193 A | 3/1975 | Young | |
| 3,954,140 A | 5/1976 | Hendrick | |
| 4,017,309 A | 4/1977 | Johnson | |
| 4,045,056 A | 8/1977 | Kandakov et al. | |
| 4,050,740 A | 9/1977 | Ellithorpe et al. | |
| 4,261,671 A | 4/1981 | Langner | |
| 4,296,157 A * | 10/1981 | Conti | 138/121 |
| 4,360,042 A * | 11/1982 | Fouss et al. | 138/119 |
| 4,854,372 A | 8/1989 | Sakaya et al. | |
| 5,026,209 A | 6/1991 | Titmas et al. | |
| 5,078,544 A | 1/1992 | Harzer et al. | |
| 5,106,235 A * | 4/1992 | King | 405/154.1 |
| 5,368,092 A | 11/1994 | Rearden et al. | |
| 5,515,679 A | 5/1996 | Shulman | |
| 6,409,226 B1 | 6/2002 | Slack et al. | |
| 6,629,390 B2 | 10/2003 | Wood, Jr. et al. | |
| 6,698,976 B1 | 3/2004 | Cho | |

(Continued)

FOREIGN PATENT DOCUMENTS

| | | |
|---|---|---|
| RU | 1818459 | 5/1993 |
| SU | 614314 | 7/1978 |

(Continued)

OTHER PUBLICATIONS

PCT/US2012/051185; filed Aug. 16, 2012; Red Leaf Resources, Inc. et al.; international search report dated Feb. 27, 2013.

*Primary Examiner* — Patrick F Brinson
(74) *Attorney, Agent, or Firm* — Thorpe North & Western LLP

(57) ABSTRACT

A vertically compactable fluid transfer device (10) can include a lateral fluid transfer conduit (12) to convey a fluid transfer fluid therethrough and to be supported by particles (16) packed to a first density. Additionally, the device (10) can include a riser (14) coupled to, and in fluid communication with, the lateral fluid transfer conduit (12). The riser (14) can be vertically compactable by at least 20% while maintaining structural integrity when the lateral fluid transfer conduit lowers as the supporting particles (16) pack to a second density, which is higher than the first density.

22 Claims, 7 Drawing Sheets

(56) References Cited

U.S. PATENT DOCUMENTS

| | | |
|---|---|---|
| 7,143,788 B2 * | 12/2006 | Keyes .......................... 138/120 |
| 7,198,107 B2 | 4/2007 | Maguire |
| 7,418,979 B2 * | 9/2008 | Keyes .......................... 138/120 |
| 7,743,826 B2 | 6/2010 | Harris et al. |
| 8,003,844 B2 | 8/2011 | Dana et al. |
| 8,109,047 B2 | 2/2012 | Dana et al. |
| 2008/0190816 A1 | 8/2008 | Dana et al. |
| 2009/0200023 A1 | 8/2009 | Costello et al. |
| 2010/0206518 A1 | 8/2010 | Patten et al. |
| 2012/0027516 A1 | 2/2012 | Day et al. |
| 2012/0119562 A1 | 5/2012 | Latham et al. |

FOREIGN PATENT DOCUMENTS

| | | |
|---|---|---|
| SU | 724715 | 3/1980 |
| WO | WO 81/03061 | 4/1981 |
| WO | WO 2008/014848 | 2/2008 |
| WO | WO 2010/093817 | 8/2010 |

\* cited by examiner

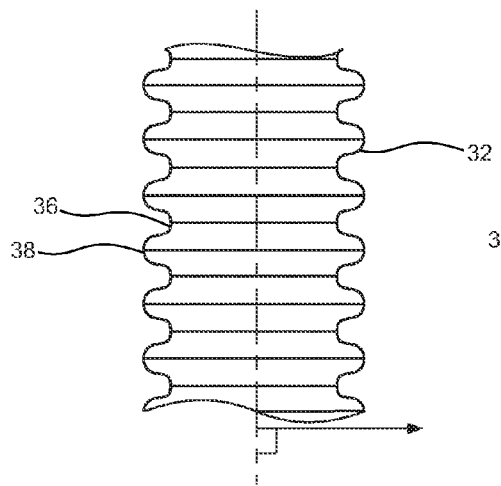
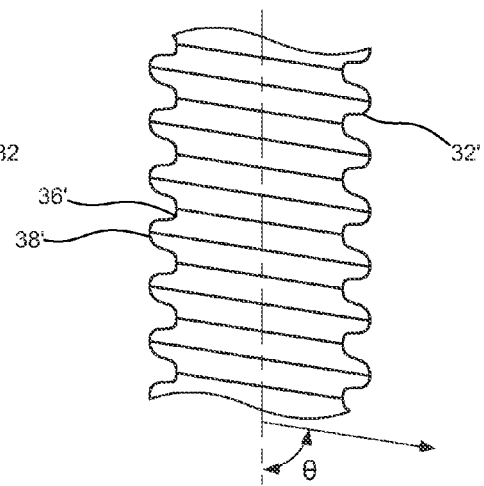
FIG. 2A    FIG. 2B
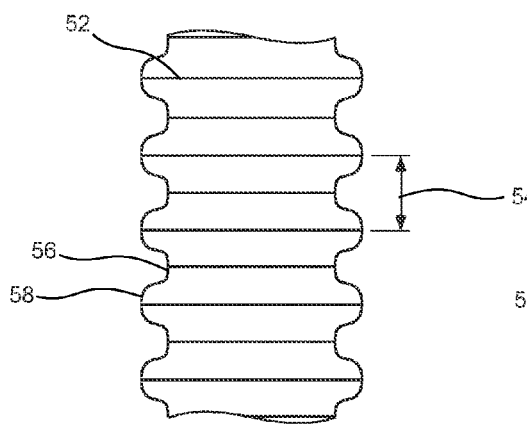
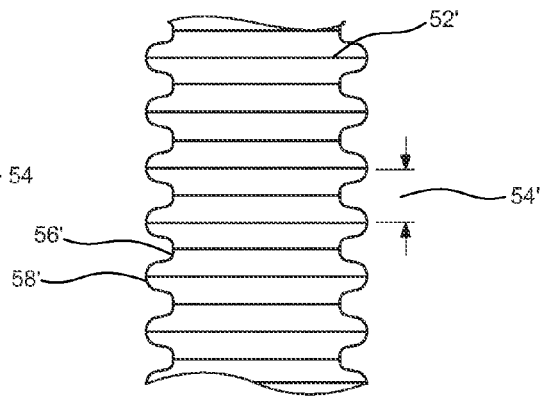
FIG. 3A    FIG. 3B

VERTICALLY COMPACTABLE FLUID TRANSFER DEVICE

RELATED APPLICATION

This application claims the benefit of U.S. Provisional Application No. 61/524,142, filed Aug. 16, 2011 which is incorporated herein by reference.

FIELD OF THE INVENTION

The present invention relates generally to heating or otherwise treating a subsiding mass using embedded conduits and structures to allow maintaining structural integrity during subsidence. Accordingly, the invention involves the fields of mechanical engineering and chemical engineering.

BACKGROUND

Global and domestic demand for fossil fuels continues to rise despite price increases and other economic and geopolitical concerns. As such demand continues to rise, research and investigation into finding additional economically viable sources of fossil fuels correspondingly increases. Historically, many have recognized the vast quantities of energy stored in oil shale, coal and tar sand deposits, for example. However, these sources remain a difficult challenge in terms of economically competitive recovery. Canadian tar sands have shown that such efforts can be fruitful, although many challenges still remain, including environmental impact, product quality, production costs, and process time, among others.

Estimates of world-wide oil shale reserves range from two to almost seven trillion barrels of oil, depending on the estimating source. Regardless, these reserves represent a tremendous volume and remain a substantially untapped resource. A large number of companies and investigators continue to study and test methods of recovering oil from such reserves. In the oil shale industry, methods of extraction have included underground rubble chimneys created by explosions, in-situ methods such as In-Situ Conversion Process (ICP) method (Shell Oil), and heating within steel fabricated retorts. Other methods have included in-situ radio frequency heating (microwaves), and "modified" in-situ processes wherein underground mining, blasting and retorting have been combined to make rubble out of a formation to allow for better heat transfer and product removal.

Among typical oil shale processes, all face tradeoffs in economics and environmental concerns. No current process alone satisfies economic, environmental and technical challenges. Moreover, global warming concerns give rise to additional measures to address carbon dioxide ($CO_2$) emissions that are associated with such processes. Methods are needed that accomplish environmental stewardship, yet still provide high-volume cost-effective oil production.

Below ground in-situ concepts emerged based on their ability to produce high volumes while avoiding the cost of mining. While the cost savings resulting from avoiding mining can be achieved, the in-situ method requires heating a formation for a long period of time due to the extremely low thermal conductivity and high specific heat of solid oil shale. Perhaps the most significant challenge for any in-situ process is the uncertainty and long-term potential of water contamination that can occur with underground freshwater aquifers. In the case of Shell's ICP method, a "freeze wall" is used as a barrier to keep separation between aquifers and an underground treatment area. Long-term prevention of contamination has yet to be conclusively demonstrated and there are few remedies should a freeze wall fail, so other methods are desirable to address such environmental risks.

One method and system that addresses many of these problems is disclosed and claimed in U.S. Pat. No. 7,862,705 and entitled "Methods of Recovering Hydrocarbons from Hydrocarbonaceous Material Using a Constructed Infrastructure and Associated Systems," which is incorporated by reference herein in its entirety. In that patent, a method of recovering hydrocarbons from hydrocarbonaceous materials is disclosed including forming a constructed permeability control infrastructure. This constructed infrastructure defines a substantially encapsulated volume. A mined hydrocarbonaceous material, such as oil shale, can be introduced into the control infrastructure to form a permeable body of hydrocarbonaceous material. The permeable body can be heated by an embedded conduit within the permeable body sufficient to reform and remove hydrocarbons therefrom leaving a lean shale or other earthen material. Removed hydrocarbons can be collected for further processing, use in the process as supplemental fuel or additives, and/or direct use without further treatment. The lean shale or other material may remain in the infrastructure. The control infrastructure can include fully lined impermeable walls or impermeable sidewalls with a substantially impermeable floor and cap.

SUMMARY

A vertically compactable fluid transfer device is disclosed, which can be embedded within hydrocarbonaceous material and used to extract hydrocarbons from the hydrocarbonaceous material. The device can maintain structural integrity upon settling of the hydrocarbonaceous material as the hydrocarbons are released. The device can include a lateral fluid transfer conduit to convey a fluid therethrough. The lateral fluid transfer conduit can be supported by particles packed to a first density. Additionally, the device can include a riser coupled to, and in fluid communication with, the lateral fluid transfer conduit. The riser can compact vertically while maintaining structural integrity when the lateral fluid transfer conduit lowers as the supporting particles pack to a second density, which is higher than the first density. The lateral fluid transfer conduit and riser can circulate a heat transfer fluid, hydrocarbons, gases, or other fluids through the system. The system can be operated as a heat transfer system, fluid dispersion system, collection system and/or as a combination of these operations.

The supporting particles can comprise hydrocarbonaceous material such as oil shale or coal, although other subsiding materials can be used. Such a vertically compactable fluid transfer device can be used to effectively extract hydrocarbons from hydrocarbonaceous material. Additionally, the device can reduce or minimize the risk of structural failure upon settling of the hydrocarbonaceous material as the hydrocarbons are released.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

Features and advantages of the invention will be apparent from the detailed description that follows, and which taken in conjunction with the accompanying drawings, together illustrate features of the invention. It is understood that these drawings merely depict exemplary embodiments and are not, therefore, to be considered limiting of its scope. And furthermore, it will be readily appreciated that the components, as generally described and illustrated in the figures herein, could be arranged and designed in a wide variety of different configurations.

FIG. 2A is a corrugation configuration, in accordance with an example of the present disclosure.

FIG. 2B is a corrugation configuration, in accordance with another example of the present disclosure.

FIG. 3A is a vertically compactable portion of a riser, in accordance with one example of the present disclosure.

FIG. 3B is the riser portion of FIG. 3A in a vertically compacted configuration.

DETAILED DESCRIPTION

Figure 1A:
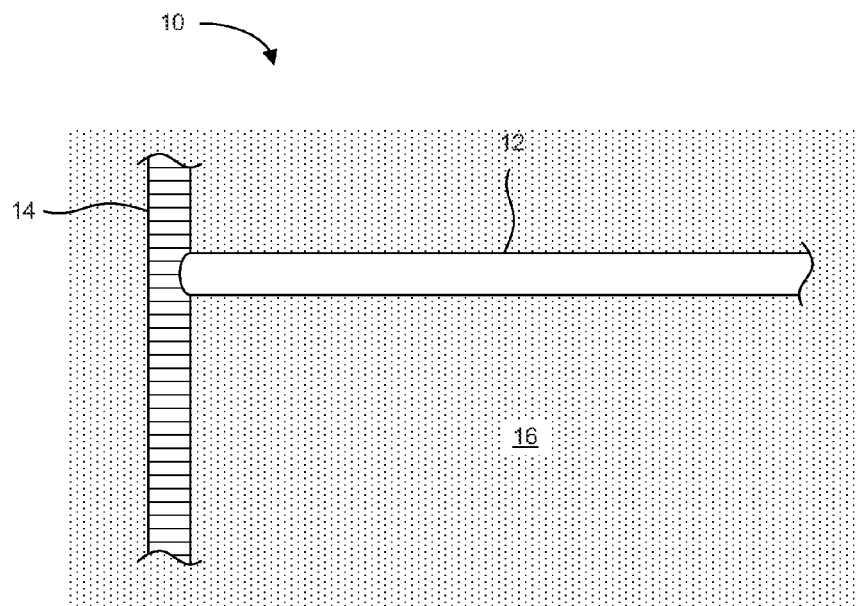
FIG. 1A is a portion of a vertically compactable fluid transfer device, in accordance with an example of the present disclosure.

Reference will now be made to exemplary embodiments and specific language will be used herein to describe the same. It will nevertheless be understood that no limitation of the scope of the present invention is thereby intended. Alterations and further modifications of the inventive features described herein, and additional applications of the principles of the invention as described herein, which would occur to one skilled in the relevant art and having possession of this disclosure, are to be considered within the scope of the invention. Further, before particular embodiments are disclosed and described, it is to be understood that this invention is not limited to the particular process and materials disclosed herein as such may vary to some degree. It is also to be understood that the terminology used herein is used for the purpose of describing particular embodiments only and is not intended to be limiting, as the scope of the present invention will be defined only by the appended claims and equivalents thereof.

It must be noted that, as used in this specification and the appended claims, the singular forms "a," "an," and "the" include plural referents unless the context clearly dictates otherwise. Thus, for example, reference to "a riser section" includes one or more of such riser sections and reference to "a conduit section" includes reference to one or more of such conduit sections.

In describing and claiming the present invention, the following terminology will be used in accordance with the definitions set forth below.

As used herein, "conduit" refers to any passageway along a specified distance which can be used to transport materials and/or heat from one point to another point. Although conduits can generally be circular pipes, other non-circular conduits can also be useful, e.g. oblong, rectangular, etc. Conduits can advantageously be used to transfer heat throughout the packed particles. Generally, conduits can also be used to deliver fluids to the packed particles and/or remove fluids from the packed particles.

As used herein, "longitudinal axis" refers to the long axis or centerline of a conduit or passage.

As used herein, "transverse" refers to a direction that cuts across a referenced plane or axis at an angle ranging from perpendicular to about 45 degrees off the referenced plane or axis.

As used herein, "lateral fluid transfer conduit" refers to a conduit included in a vertically compactable fluid transfer device that is oriented such that a longitudinal axis of the lateral fluid transfer conduit is at an angle ranging +/−45 degrees relative to horizontal.

As used herein, "riser" refers to a conduit included in a vertically compactable heat transfer device that is oriented such that a longitudinal axis of the riser is at an angle ranging within +/−45 degrees relative to vertical.

As used herein, "constructed infrastructure" refers to a structure which is substantially entirely man made, as opposed to freeze walls, sulfur walls, or other barriers which are formed by modification or filling pores of an existing geological formation. The constructed permeability control infrastructure is often substantially free of undisturbed geological formations, although the infrastructure can be formed adjacent or in direct contact with an undisturbed formation. The infrastructure is most often formed at least partially of an earthen material and derives structural support from existing grade (i.e. formation of infrastructure floors along existing grade). Such a control infrastructure can be unattached or affixed to an undisturbed formation by mechanical means, chemical means or a combination of such means, e.g. bolted into the formation using anchors, ties, or other suitable hardware.

As used herein, "comminuted" refers to breaking a formation or larger mass into pieces. A comminuted mass can be rubbilized or otherwise broken into fragments.

As used herein, "hydrocarbonaceous material" refers to any hydrocarbon-containing material from which hydrocarbon products can be extracted or derived. For example, hydrocarbons may be extracted directly as a liquid, removed via solvent extraction, directly vaporized or otherwise removed from the material. However, many hydrocarbonaceous materials contain kerogen or bitumen which is converted to a hydrocarbon product through heating and pyrolysis. Hydrocarbonaceous materials can include, but is not limited to, oil shale, tar sands, coal, lignite, bitumen, peat, and other organic materials.

As used herein, "particle" refers to distinct solids. Typically, a particle can have a size from about ⅛ inch to about 6 feet, although sizes outside this range may be suitable. Additional guidance and more specific size ranges are set forth hereinafter.

As used herein, "mined" refers to a hydrocarbonaceous or other earthen material which has been removed or disturbed from an original stratographic or geological location to a second and different location or returned to the same location. Typically, mined material can be produced by rubbilizing, crushing, explosively detonating, drilling or otherwise removing material from a geologic formation.

As used herein, "impoundment" refers to a structure designed to hold or retain an accumulation of fluid and/or solid moveable materials. An impoundment generally derives at least a substantial portion of foundation and structural support from earthen materials. Thus, the control walls do not always have independent strength or structural integrity apart from the earthen material and/or formation against which they are formed.

As used herein, "lean material" or similar terminology refers to a treated hydrocarbonaceous material, such as oil shale, tar sands, and the like, from which some or all of the hydrocarbons have been removed.

As used herein, "permeable body" refers to any mass of comminuted hydrocarbonaceous material having a relatively high permeability which exceeds permeability of a solid undisturbed formation of the same composition. Suitable permeable bodies can have greater than about 10% void space and typically have void space from about 30% to 50%, although other ranges may be suitable. Allowing for high permeability facilitates, for example, through the incorporation of large irregularly shaped particles, heating of the body through convection as the primary heat transfer away from the conduits and into the body, while also substantially reducing costs associated with crushing to very small sizes, e.g. below about 1 to about 0.5 inch.

As used herein, "wall" refers to any constructed feature having a permeability control contribution to confining material within an encapsulated volume defined at least in part by control walls. Walls can be oriented in any manner such as vertical, although ceilings, floors and other contours defining the encapsulated volume can also be "walls" as used herein.

As used herein, "substantially stationary" refers to nearly stationary positioning of materials with a degree of allowance for subsidence, expansion due to the popcorn effect, and/or settling as hydrocarbons are removed from the hydrocarbonaceous material from within the enclosed volume to leave behind lean material. In contrast, any circulation and/or flow of hydrocarbonaceous material such as that found in fluidized beds or rotating retorts involves highly substantial movement and handling of hydrocarbonaceous material. It is understood that some organic-rich or hydrocarbon-rich materials can result in a high degree of subsidence (e.g. up to 80% in some cases) and such subsidence as a result of settling is "substantially stationary" within the context of this system.

As used herein, "substantial" when used in reference to a quantity or amount of a material, or a specific characteristic thereof, refers to an amount that is sufficient to provide an effect that the material or characteristic was intended to provide. The exact degree of deviation allowable may in some cases depend on the specific context. Similarly, "substantially free of" or the like refers to the lack of an identified element or agent in a composition. Particularly, elements that are identified as being "substantially free of" are either completely absent from the composition, or are included only in amounts which are small enough so as to have no measurable effect on the composition.

As used herein, "about" refers to a degree of deviation based on experimental error typical for the particular property identified. The latitude provided the term "about" will depend on the specific context and particular property and can be readily discerned by those skilled in the art. The term "about" is not intended to either expand or limit the degree of equivalents which may otherwise be afforded a particular value. Further, unless otherwise stated, the term "about" shall expressly include "exactly," consistent with the discussion below regarding ranges and numerical data.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

Concentrations, dimensions, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a range of about 1 to about 200 should be interpreted to include not only the explicitly recited limits of 1 and 200, but also to include individual sizes such as 2, 3, 4, and sub-ranges such as 10 to 50, 20 to 100, etc.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Any steps recited in any method or process claims may be executed in any order and are not limited to the order presented in the claims unless otherwise stated. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

A vertically compactable fluid transfer device can be buried inside a permeable body of mined hydrocarbonaceous material, such as oil shale, tar sands, coal, etc., that is contained within a constructed permeability control infrastructure, and from which hydrocarbon products are intended to be extracted. The hydrocarbon products can be extracted by passing a heat transfer fluid, such as hot air, hot exhaust gases, steam, hydrocarbon vapors and/or hot liquids, into or through conduits of the buried vertically compactable heat transfer device to heat the hydrocarbonaceous material to temperature levels sufficient to remove hydrocarbons therefrom. In order for the extraction process to be effective, it can be desirable to raise the temperature of the permeable body to between 200° F. and 900° F. to initiate pyrolysis. Consequently, the temperature of the heat transfer fluid within the vertically compactable heat transfer device can be elevated to even higher temperatures to maintain a constant flow of heat away from the heat transfer fluid and into the permeable body.

The systems described herein can also be used in connection with fluid delivery to the permeable body and/or collection and removal of fluids from the permeable body. Such systems include fluid inlets and/or outlets to allow transfer of fluid between the permeable body and the fluid transfer system. These inlet and outlets can be distributed along lateral conduits and/or risers.

It has been discovered that during the heating and/or pyrolysis processes the permeable body of hydrocarbonaceous material can undergo significant vertical subsidence movement and settling as the hydrocarbons are released to flow downwards as a liquid or upwards as a gas. The vertical subsidence of the permeable body can impart transverse shear stresses to the structures buried within the permeable body, leading to a build-up of harmful lateral stresses in the walls and joints of the heating conduits or other conduits. When focused at localized stress-concentration points, the shear-induced stresses can exceed the material limits of the conduit walls and joints, resulting in a rupture that allows the heating fluid to escape or otherwise impair other designated functions of the conduit. It is desirable, therefore, to maintain the structural integrity of the conduit buried within the subsiding permeable body through mitigation of the harmful subsidence-induced effects experienced by the conduit.

The amount of vertical subsidence experienced by the permeable body can vary greatly, depending upon composition of the hydrocarbonaceous material and its initial configuration. The amount of vertical movement of the top surface can sometimes range between 5% and 80% of the initial vertical height of the body, depending on the type of hydrocarbonaceous material. A subsidence of 12%-40% can be common for oil shale, although up to about 50% can be encountered for some kerogen-rich shale. In one oil shale example, about 30 inches of subsidence was realized in a 16 foot deep permeable body. Oil shale containing large amounts of hydrocarbonaceous material may have greater subsidence than oil shale that has lesser amounts of hydrocarbonaceous material. Similarly, up to 80% subsidence can be seen for some high quality coal. However, subsidence greater than 25% subsidence can generally be encountered for most coals and tar sands. Similarly, particle size can affect the degree of subsidence and whether particle size distributions are relatively larger or narrower and the associated packing density of the particles.

An additional complication introduced during processing is non-uniform subsidence. It is not uncommon for spatial variations in particle packing, particle sizes, heat transfer, conversion efficiency, hydrocarbon content, and the like to result in variations in degree of subsidence throughout the permeable body. Thus, portions of the conduit system can experience higher subsidence-induced stresses than adjacent portions of the conduit system. Such subsidence variations can range from 0% to about 60% depending on the particular permeable body and processing conditions. Typically, horizontal movement during subsidence is modest such that stresses transverse to vertical are insufficient to cause failure. However, corrugated collapsible sections can be used in horizontal section of conduit in order to accommodate local variations in vertical subsidence which can create some transverse stresses.

The heat transfer structures of the present invention can be applied at almost any scale. Larger encapsulated volumes and increased numbers of impoundments can readily produce hydrocarbon products and performance comparable to or exceeding smaller constructed infrastructures. As an illustration, single impoundments can range in size from tens of meters across to tens of acres. Optimal impoundment sizes may vary depending on the hydrocarbonaceous material and operating parameters, however typical current suitable areas can range from about one-half to twenty acres in top plan surface area. In one specific aspect, the top plan surface area can be about 10 to about 12 acres.

Non-limiting examples of mined hydrocarbonaceous material which can be treated comprise oil shale, tar sands, coal, lignite, bitumen, peat, biomass, or combinations thereof. In some cases it can be desirable to provide a single type of hydrocarbonaceous material so that the permeable body consists essentially of one of the above materials. However, the permeable body can include mixtures of these materials such that grade, oil content, hydrogen content, permeability and the like can be adjusted to achieve a desired result. Further, different hydrocarbon materials can be placed in multiple layers or in a mixed fashion such as combining coal, oil shale, tar sands, biomass, and/or peat.

As a general guideline, the permeable body can include particles from about ⅛ inch to about 6 feet, and in some cases less than 1 foot and in other cases less than about 6 inches. However, as a practical matter, sizes from about 2 inches to about 2 feet can provide good results with about 1 foot diameter being useful for oil shale especially. Void space can be an important factor in determining optimal particle diameters. As a general matter, any functional void space can be used; however, about 15% to about 60% and in some cases about 40%-50% usually provides a good balance of permeability and effective use of available volumes. Void volumes can be varied somewhat by varying other parameters such as heating conduit placement, additives, and the like. Mechanical separation of mined hydrocarbonaceous materials allows creation of fine mesh, high permeability particles which enhance thermal dispersion rates once placed within the impoundment. The added permeability allows for more reasonable, low temperatures which also help to avoid higher temperatures which result in greater $CO_2$ production from carbonate decomposition and associated release of trace heavy metals, volatile organics, and other compounds which can create toxic effluent and/or undesirable materials which must be monitored and controlled.

Comminuted hydrocarbonaceous material can be filled into the control infrastructure to form the permeable body in any suitable manner. Typically the comminuted hydrocarbonaceous material can be conveyed into the control infrastructure by dumping, conveyors or other suitable approaches. As mentioned previously, the permeable body can have a suitably high void volume. Indiscriminate dumping can result in excessive compaction and reduction of void volumes. Thus, the permeable body can be formed by low compaction conveying of the hydrocarbonaceous material into the infrastructure. For example, retracting conveyors can be used to deliver the material near a top surface of the permeable body as it is formed. In this way, the hydrocarbonaceous material can retain a significant void volume between particles without substantial further crushing or compaction despite some small degree of compaction which often results from lithostatic pressure as the permeable body is formed.

Once a desired permeable body has been formed within the control infrastructure, heat can be introduced sufficient to begin removal of hydrocarbons, e.g. via pyrolysis. A suitable heat source can be thermally associated with the permeable body. Optimal operating temperatures within the permeable body can vary depending on the composition and desired products. However, as a general guideline, operating temperatures can range from about 200° F. to about 750° F. Temperature variations throughout the encapsulated volume can vary and may reach as high as 900° F. or more in some areas. In one embodiment, the operating temperature can be a relatively lower temperature to facilitate production of liquid product such as from about 200° F. to about 750° F. This heating step can be a roasting operation which results in benefaction of the crushed ore of the permeable body. Temperature, pressure, and other variables can be controlled sufficient to produce predominantly, and in some cases substantially only, liquid product. Generally, products can include both liquid and gaseous products, while liquid products can require fewer processing steps such as scrubbers etc. The relatively high permeability of the permeable body allows for production of liquid hydrocarbon products and minimization of gaseous products, depending to some extent on the particular starting materials and operating conditions.

Figure 1B:
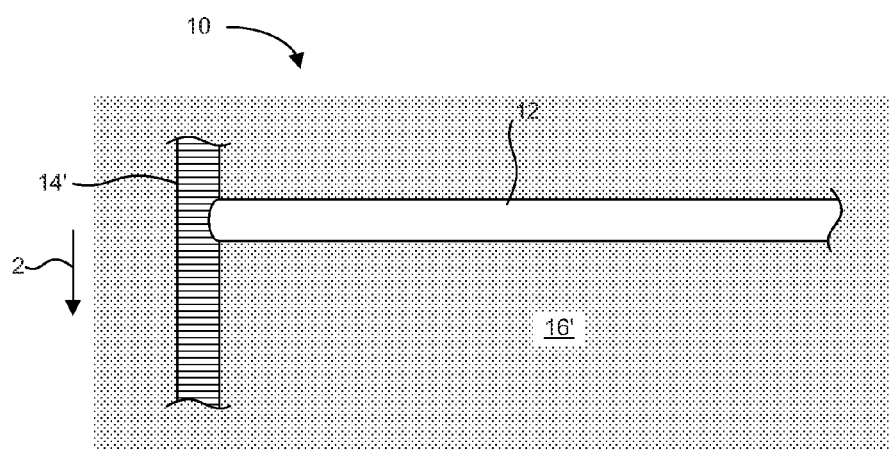
FIG. 1B is the vertically compactable fluid transfer device of FIG. 1A in a vertically compacted configuration.

As mentioned above, a vertically compactable heat transfer device can be embedded within the permeable body. With reference to FIGS. 1A and 1B, illustrated is a vertically compactable heat transfer device 10. The device 10 can include conduits, such as a lateral heat transfer conduit 12 and a riser 14, to convey a heat transfer fluid. Thus, the riser 14 portions also act as heat transfer pathways into the permeable body. Conduits can be configured for use as heating pipes, cooling pipes, heat transfer pipes, drainage pipes, or gas pipes. Further, the conduits can be dedicated to a single function or may serve multiple functions during operation of the infrastructure, i.e. heat transfer and drainage. Cross-sectional size can be constant or vary along a length of the conduit. When used for heating, conduit can include fins, vanes, or other features to enhance heat transfer between the conduit and a surrounding environment, such as a permeable body of hydrocarbonaceous material. The conduits can be formed of any suitable material, depending on the intended function. In one aspect, heating conduit can be constructed of materials that provide suitable heat transfer and structural characteristics for the vertically compactable heat transfer device. Non-limiting examples of suitable materials can include sheet metal, clay pipes, refractory cement pipes, refractory ECC pipes, poured in place pipes, metal pipes such as cast iron, stainless steel etc., polymer such as PVC, and the like. In one specific embodiment, all or at least a portion of the embedded conduits can comprise a degradable material. For example, non-galvanized 6 inch cast iron pipes can be effectively used for single use embodiments and perform well over the useful life of the impoundment, typically less than about 2 years. Further, different portions of the conduits can be formed of different materials. Poured in place pipes can be especially useful for very large encapsulation volumes where pipe diameters exceed several feet. Such pipes can be formed using flexible wraps which retain a viscous fluid in an annular shape. For example, PVC pipes can be used as a portion of a form along with flexible wraps, where concrete or other viscous fluid is pumped into an annular space between the PVC and flexible wrap. Depending on the intended function, perforations or other apertures can be made in the conduits to allow fluids to flow between the conduits and the permeable body. Typical operating temperatures exceed the melting point of conventional polymer and resin pipes. In some embodiments, the conduits can be placed and oriented such that the conduits intentionally melt or otherwise degrade during operation of the infrastructure. Although specific conduit dimensions can vary widely from 1 inch to 80 inches in diameter, hydrocarbon production processes can often involve conduit diameters from about 15 inches to about 35 inches in diameter. Although not required, riser manifold sections can have a relatively larger diameter than connected horizontal sections. For example, typical manifold sections can have a diameter from about 1.5 to about 4 times the diameter of connected horizontal sections. As such, riser diameters can range from about 15 inches to about 80 inches in diameter and in some cases from about 36 inches to about 68 inches in diameter.

Corresponding depths of the permeable body can thus range widely from several feet to several hundred feet, and in some cases range from about 40 feet to about 300 feet in depth.

Conduits of the vertically compactable heat transfer device can be readily oriented in any configuration, whether substantially horizontal, vertical, slanted, branched, or the like. At least a portion of the conduits can be oriented along predetermined pathways prior to embedding the vertically compactable heat transfer device within the permeable body. The predetermined pathways can be designed to improve heat transfer, gas-liquid-solid contacting, maximize fluid delivery or removal from specific regions within the encapsulated volume, or the like. Further, at least a portion the conduits can be dedicated to heating of the permeable body. These heating conduits can be selectively perforated to allow heated gases or other fluids to convectively heat and mix throughout the permeable body. The perforations can be located and sized to optimize even and/or controlled heating throughout the permeable body. Alternatively, the heating conduits can form a closed loop such that heating gases or fluids are segregated from the permeable body. Thus, a "closed loop" does not necessarily require recirculation, rather isolation of heating fluid from the permeable body. In this manner, heating can be accomplished primarily or substantially only through thermal conduction across the conduit walls from the heating fluids into the permeable body. Heating in a closed loop allows for prevention of mass transfer between the heating fluid and permeable body and can reduce formation and/or extraction of gaseous hydrocarbon products.

Further, conduits can be oriented among a plurality of impoundments and/or control infrastructures to transfer fluids and/or heat between the structures. The conduits can be welded to one another using conventional welding or the like. Further, the conduits can include junctions which allow for rotation and or small amounts of movement during expansion and subsidence of material in the permeable body. Additionally, the conduits can include a support system which acts to support the assembly of conduits prior to and during filling of the encapsulated volume, as well as during operation. For example, during heating flows of fluids, heating and the like can cause expansion (fracturing or popcorn effect) or subsidence sufficient to create potentially damaging stress and strain on the conduits and associated junctions. A truss support system or other similar anchoring members can be useful in reducing damage to the conduits. The anchoring members can include cement blocks, I-beams, rebar, columns, etc., which can be associated with walls of the impoundment, including side walls, floors and ceilings.

Alternatively, the conduits of the vertically compactable heat transfer device can be completely constructed and assembled prior to introduction of any mined materials into the control infrastructure. Care and planning can be considered in designing the predetermined pathways of the conduits and method of filling the volume in order to prevent damage to the vertically compactable heat transfer device during the filling process as the conduits are buried. Thus, as a general rule, the conduits used in the present invention are oriented ab initio, or prior to embedding the vertically compactable heat transfer device in the permeable body such that they are non-drilled. As a result, construction of the conduits and placement thereof can be performed without extensive core drilling and/or complicated machinery associated with wellbore or horizontal drilling. Rather, horizontal or any other orientation of conduit can be readily achieved by assembling the desired predetermined pathways prior to, or contemporaneous with, filling the infrastructure with the hydrocarbonaceous material. The non-drilled, hand/crane-placed conduits oriented in various geometric patterns can be laid with valve controlled connecting points which yield precise and closely monitored heating within the control infrastructure. The ability to place and layer conduits including connecting, bypass and flow valves, and direct injection and exit points, allow for precision temperature and heating rates, precision pressure and pressurization rates, and precision fluid and gas ingress, egress and composition admixtures. For example, when a bacteria, enzyme, or other biological material is used, optimal temperatures can be readily maintained throughout the permeable body to increase performance, reaction, and reliability of such biomaterials.

With continued reference to FIG. 1A, the riser 14 can be coupled to, and in fluid communication with, the lateral heat transfer conduit 12. The riser 14 and the lateral conduits 12 can be coupled using any suitable method such as, but not limited to, welds (e.g. welded overlapping slip joints), threads, detents, and the like. In one particular aspect, the conduits can be coupled using welded overlapping slip joints. Additionally, the lateral heat transfer conduit 12 can be supported by particles 16, such as a permeable body of hydrocarbonaceous material. The particles 16 can be packed to a first density as previously described. For example, the first density of particles 16 can be the density that results in a loose fill situation, where the particles have been deposited without subsequent compaction of the particles by external means. This relatively low density initial condition can contribute to interstitial gas and/or liquid flow during pyrolysis.

The vertically compactable heat transfer device 10 can be configured to transfer heat between the lateral conduit 12 and a surrounding environment comprised of a body of the particles 16. As the hydrocarbons are produced and/or released from the permeable body of hydrocarbonaceous material during heating, particles 16 experience vertical subsidence movement and settling. As the particles 16 settle, the particles can become progressively compacted to a second density higher than the first density. In other words, as the particles 16 are heated by the heat transfer device 10, the particles can become more compact or of a higher density. Typically, for a given quantity of particles 16, a higher density of particles will occupy less space than a lower density of particles. Thus, as the particles 16 become more compacted, a height of the body of particles will decrease. Because the particles 16 support the lateral heat transfer conduit 12, this densification of the particles can cause the lateral heat transfer conduit 12 to lower.

The riser 14 is configured to maintain structural integrity as the lateral heat transfer conduit 12 lowers, which may be up to about a 40% or more decrease in height over the course of the extraction process. Thus, as illustrated in FIG. 1B, the riser 14' can compact vertically while maintaining structural integrity when the lateral heat transfer conduit 12 lowers in direction 2 as the supporting particles 16' pack to a second density, which is higher than the first density. In one aspect, the riser can be substantially vertical. In another aspect, the riser can be vertically compacted by at least 20%, and in some cases at least 40% and maintain structural integrity. Imparting flexibility to the vertically compactable heat transfer device via the vertically compactable riser, therefore, can minimize stress in the conduits of the device as a result of subsidence of the permeable body of hydrocarbonaceous material.

Compactability of a riser can be achieved, for example, by including corrugations in the riser, as illustrated in FIGS. 2A and 2B. In one aspect, the corrugations 32 can follow a continuously-repeating sinusoidal pattern of smoothly-curved troughs 36 and peaks 38, as shown. In other aspects the corrugations can have different shapes, such as flats at the tops of the peaks and bottoms of the troughs, or linear walls for the transition surfaces, or brief sections of smooth, straight pipe between corrugations, etc. Furthermore, the corrugations 32 can be aligned perpendicular to the longitudinal axis of the heating conduit (FIG. 2A), or the corrugations 32' can be spiral wound at an acute angle θ relative to the longitudinal axis (FIG. 2B). The amplitude of the corrugations (the distance between 36 and 38) and the period (the distance between adjacent peaks 38) can be preconfigured to provide the optimum flexibility and durability throughout the range of temperatures and subsidence experienced by the heating conduit. The amplitude and period of corrugations also provide the significant added benefit of substantially increasing the surface area available for heat transfer. For example, although other ranges can be suitable, in a 25 to 30 inches diameter conduit, a 2 to 4 inch period with a 0.3 to 1.5 inch amplitude can be particularly effective. Additionally, the corrugations in one riser section may or may not be identical with the corrugations in another riser section. Specifically, riser sections located in upper regions of a permeable body will experience larger vertical movement than relatively lower sections. As such, corrugations and lengths can be adjusted accordingly.

The corrugated riser can be formed from a sheet of corrugated metal that has been crimped, rolled and then welded along a longitudinal seam to form a tubular conduit segment. The tubular segments can then be used as-is or welded end-to-end to other segments to form extended conduit. Alternatively, the corrugated metal sheets can be continuously spirally-welded together around and along the longitudinal length of pipe, so that no seam in the conduit wall is continuously parallel with or perpendicular to the centerline longitudinal axis of the conduit. Such corrugated conduit manufacture can be optionally done on-site with portable equipment as is commonly used in the pipe fabrication industry.

In one aspect, the riser can be flexible in that it is vertically compactable. For example, when initially situated within the permeable body, the riser can have an initial length. As the particles or hydrocarbonaceous material begin to heat up, release hydrocarbons and undergo subsidence, the lateral heat transfer conduit can begin to lower in response to the vertical subsidence movement of the permeable body. The subsidence and lowering of the lateral heat transfer conduit will continue to progress until eventually the riser vertically compacts due to its coupling with the lateral heat transfer conduit. In other words, force imparted on the riser from the lateral heat transfer conduit that would normally increase stress in the coupling, can instead cause the riser to vertically compact, thereby minimizing stress experienced at the coupling. As illustrated in FIGS. 3A and 3B, the spacing 54 between corrugations 52 can compress to a new spacing 54' by decreasing the radius of curvature (e.g. increased bending) at the troughs 56 and peaks 58 of each corrugation, allowing the riser to compact downwards and follow the motion of the permeable body without experiencing a significant increase in stress in the walls of the heating conduit or the coupling between the riser and the lateral heating conduit. The coupling will experience stresses, however, the design allows for these stresses to be kept within tolerances of the coupling. The riser can therefore maintain structural integrity when the lateral heat transfer conduit lowers.

Figure 4A:
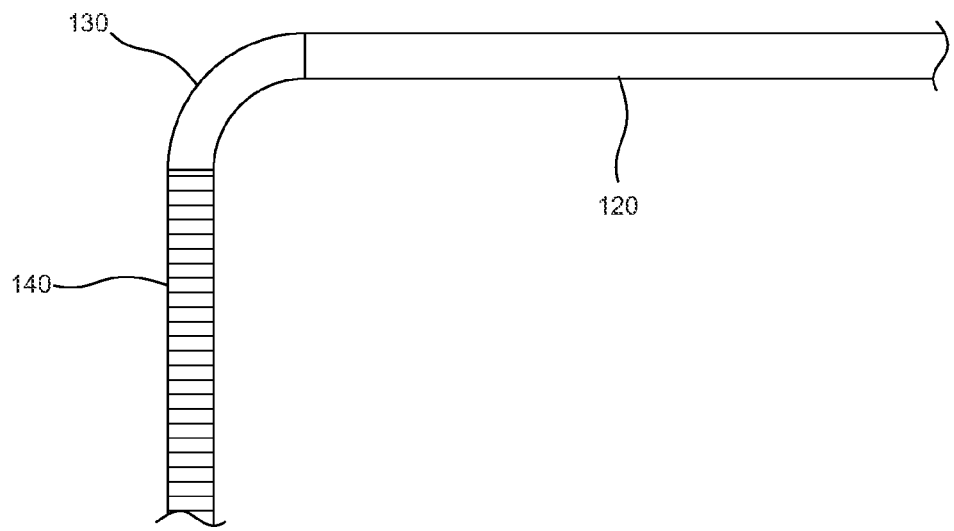
FIG. 4A is a coupling configuration for a lateral fluid transfer conduit and a riser, in accordance with an example of the present disclosure.
Figure 4B:
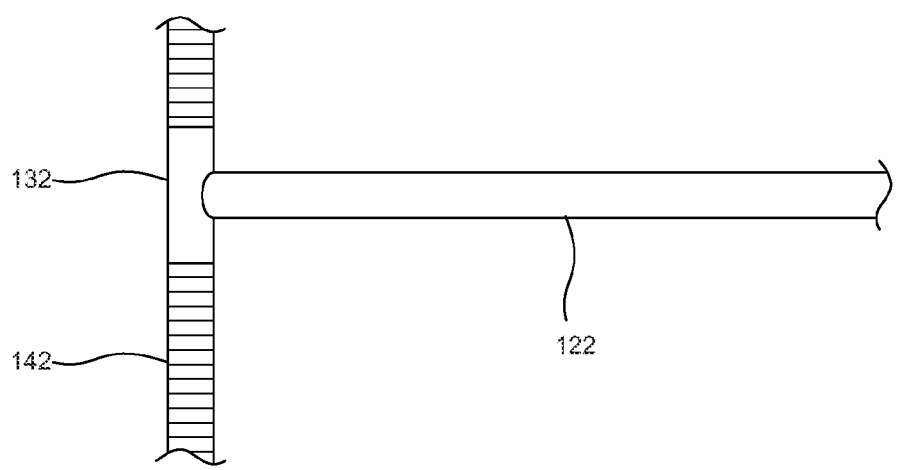
FIG. 4B is a coupling configuration for a lateral fluid transfer conduit and a riser, in accordance with another example of the present disclosure.

With reference to FIGS. 4A and 4B, illustrated are examples of coupling configurations for a lateral heat transfer conduit and a riser. As shown in FIG. 4A, a lateral heat transfer conduit 120 can be coupled to an end of a riser 140. For example, the lateral heat transfer conduit 120 and/or the riser 140 can include a transition portion 130 that transitions between a lateral orientation of the lateral heat transfer conduit 120 and a vertical orientation of the riser 140. In one aspect, the transition portion 130 can comprise an "elbow" having a 90 degree angle. The transition portion 130 allows heat transfer fluid to flow between the lateral heat transfer conduit 130 and the riser 140 while having sufficient strength to maintain structural integrity of the coupling between the lateral heat transfer conduit 120 and the riser 140 when the lateral heat transfer conduit lowers. As shown in FIG. 4B, a lateral heat transfer conduit 122 can be coupled to a mid portion of a riser 142. In one aspect, the transition portion 132 can form at least a part of a "T" connection providing a 90 degree angle between the lateral heat transfer conduit 122 and the riser 142. As illustrated in FIG. 4B, the transition portion 132 is devoid of corrugations, which can be beneficial for structural integrity of the coupling between the lateral heat transfer conduit 122 and the riser 142. The transition portions 130, 132 can thus provide for a structurally sound transition from the lateral heat transfer conduit to the vertically collapsible features of the riser. It should be noted, however, that the lateral heat transfer conduit can couple directly to the vertically collapsible features of the riser, as illustrated in FIGS. 1A and 1B.

Figure 5:
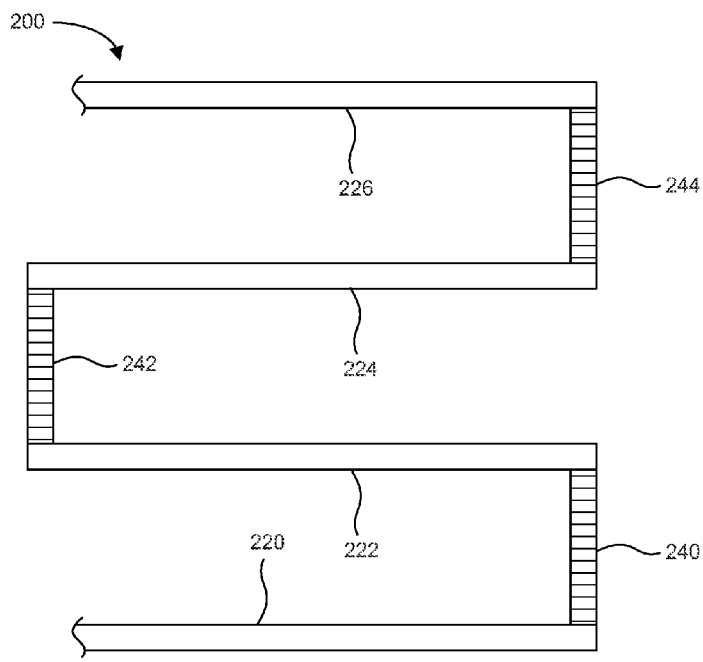
FIG. 5 is a vertically compactable fluid transfer device, in accordance with another example of the present disclosure.

With reference to FIG. 5, illustrated is a vertically compactable heat transfer device 200, which shows an example of a lateral heat transfer conduit and riser configuration. As shown in the example, a riser can comprise a plurality of riser sections 240, 242, 244 and a lateral heat transfer conduit can comprise a plurality of lateral heat transfer conduit sections 220, 222, 224, and 226. In one aspect, the riser sections and lateral heat transfer conduit sections can be alternately coupled to one another in a serpentine arrangement. Specifically, as illustrated in the example, riser section 240 can be coupled to lateral heat transfer conduit section 220, lateral heat transfer conduit section 222 can be coupled to riser section 240, riser section 242 can be coupled to lateral heat transfer conduit section 222, lateral heat transfer conduit section 224 can be coupled to riser section 242, riser section 244 can be coupled to lateral heat transfer conduit section 224, and lateral heat transfer conduit section 226 can be coupled to riser section 244 to form a serpentine arrangement. In a further aspect, the serpentine arrangement can be vertically oriented, as shown in the figure. Additionally, the plurality of riser sections can be substantially vertical. In another aspect, the riser sections and lateral heat transfer conduit sections of the serpentine arrangement can be coplanar. The riser sections and lateral heat transfer conduit sections of the serpentine arrangement, however, can be in different planes from one another.

Figure 6:
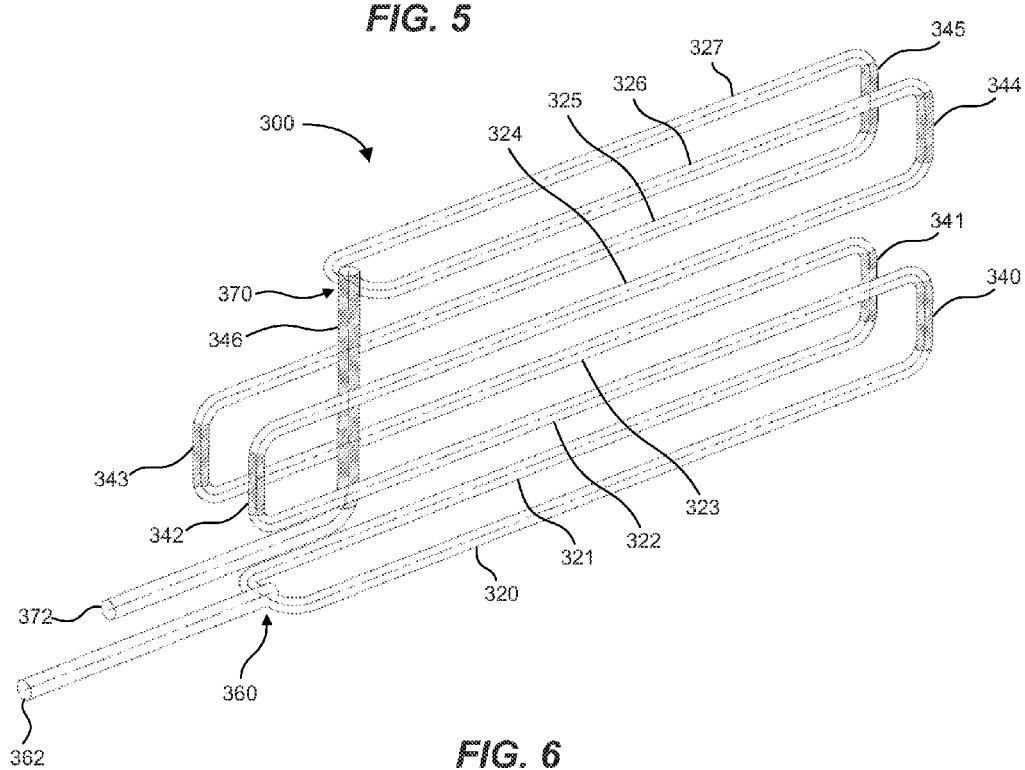
FIG. 6 is a vertically compactable fluid transfer device, in accordance with yet another example of the present disclosure.

With reference to FIG. 6, illustrated is a vertically compactable heat transfer device 300. The device 300 includes an inlet manifold 360 to separate inlet heat transfer fluid flow into at least two flow paths. For example, the inlet manifold 360 can receive heat transfer fluid flow from an inlet 362 and can separate or direct the flow into lateral heat transfer conduit sections 320, 321. In the example illustrated, lateral heat transfer conduit sections 320, 321 can each form part of a vertically oriented serpentine arrangement, as discussed above with reference to FIG. 5. Specifically, a first serpentine arrangement can include lateral heat transfer conduit sections 320, 322, 324, 326 and riser sections 340, 342, 344. A second serpentine arrangement can include lateral heat transfer conduit sections 321, 323, 325, 327 and riser sections 341, 343, 345. Each serpentine arrangement of riser sections and lateral heat transfer conduit sections can be in fluid communication with the inlet manifold 360. The inlet manifold can thus supply heat transfer fluid to a plurality of serpentine arrangements. In one aspect, the lateral heat transfer conduit, such as lateral heat transfer conduit sections 320, 320, can form at least a portion of the inlet manifold 360.

The vertically compactable heat transfer device 300 can include an outlet manifold 370 to combine outlet heat transfer fluid flow from at least two flow paths prior to exiting the device 300 through an outlet 372. For example, the outlet manifold 370 can receive heat transfer fluid flow from a lateral heat transfer conduit section, such as lateral heat transfer conduit sections 326, 327 of the first and second serpentine arrangements of riser sections and lateral heat transfer conduit sections. Thus, the riser sections and lateral heat transfer conduit sections of the serpentine arrangements are in fluid communication with the outlet manifold. The outlet manifold can therefore receive heat transfer fluid from a plurality of serpentine arrangements. In one aspect, the riser, such as riser section 346, can form at least a portion of the outlet manifold 370. In another aspect, the lateral heat transfer conduit, such as lateral heat transfer conduit sections 326, 327, can form at least a portion of the outlet manifold 370.

As illustrated in FIG. 6, a vertically compactable heat transfer device can be configured as a closed loop that acts to segregate the heat transfer fluid from the permeable body and to establish thermal conduction across the conduit walls, followed by convection of such heat as the primary mechanism for heating the permeable body. The closed system can also have an inlet, such as inlet 362, extending from the boundary of the constructed permeability control infrastructure and which is operably coupled to the heat source of the heat transfer fluid.

Generally, convective flow is generated by orienting one or more conduits or heat sources in a lower or base portion of a defined volume. By orienting the conduits in this manner, heated fluids can flow upwards and cooled fluids flow back down along a substantial majority of the volume occupied by the permeable body of hydrocarbonaceous material in a recirculating pattern.

As further illustrated in FIG. 6, the inlet 362 and the outlet 372 are disposed at a lower portion or bottom of the vertically compactable heat transfer device 300. This can be beneficial for heat transfer characteristics and/or heat transfer fluid flow characteristics of the device 300. Thus, in one aspect, the inlet 362 and/or the outlet 372 can be located at least as low as the riser, such as the riser sections, and the lateral heat transfer conduit, such as the lateral heat transfer conduit sections, of the device 300.

In certain aspects, the lateral heat transfer conduit can include sections that are of different lengths from other sections. For example, lateral heat transfer conduit section 324 is longer than lateral heat transfer conduit section 326. Different length lateral heat transfer conduit sections can enable the vertically compactable heat transfer device 300 to fit within and be covered by a side of a particle pile. When particles are deposited, such as by dumping into a pile, the side of the pile of particles can form an angle of repose relative to horizontal that is within a range that is characteristic of a given particle type, such as between about 34 degrees and about 40 degrees relative to horizontal. Thus, the heat transfer device 300, which can be designed to be disposed within a pile of particles, can be configured to have lateral heat transfer conduit sections that are vertically spaced and laterally terminated to approximate an angle of repose formed by a given pile or grouping of particles.

Figure 7:
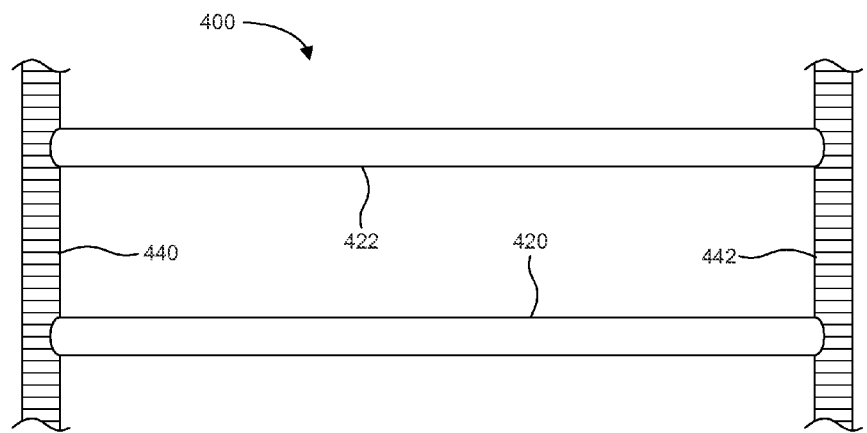
FIG. 7 is a vertically compactable fluid transfer device, in accordance with still another example of the present disclosure.

With reference to FIG. 7, illustrated is a vertically compactable heat transfer device 400, which shows an example of a lateral heat transfer conduit and riser configuration. As shown in the example, a riser can comprise two riser sections 440, 442 and a lateral heat transfer conduit can comprise a plurality of lateral heat transfer conduit sections 420, 422. These two risers can act as an inlet riser and outlet riser, respectively. In one aspect, each lateral heat transfer conduit section 420, 422 can be coupled to the two riser sections 440, 442. For example, as shown in the figure, the two riser sections 440, 442 can be coupled to one or more of the lateral heat transfer conduit sections 420, 422 at opposite ends from one another. In another aspect, the two riser sections 440, 442 can be substantially vertical. Thus, in some cases, the riser sections can be adjacently oriented on a common end of the heat transfer device.

Figure 8:
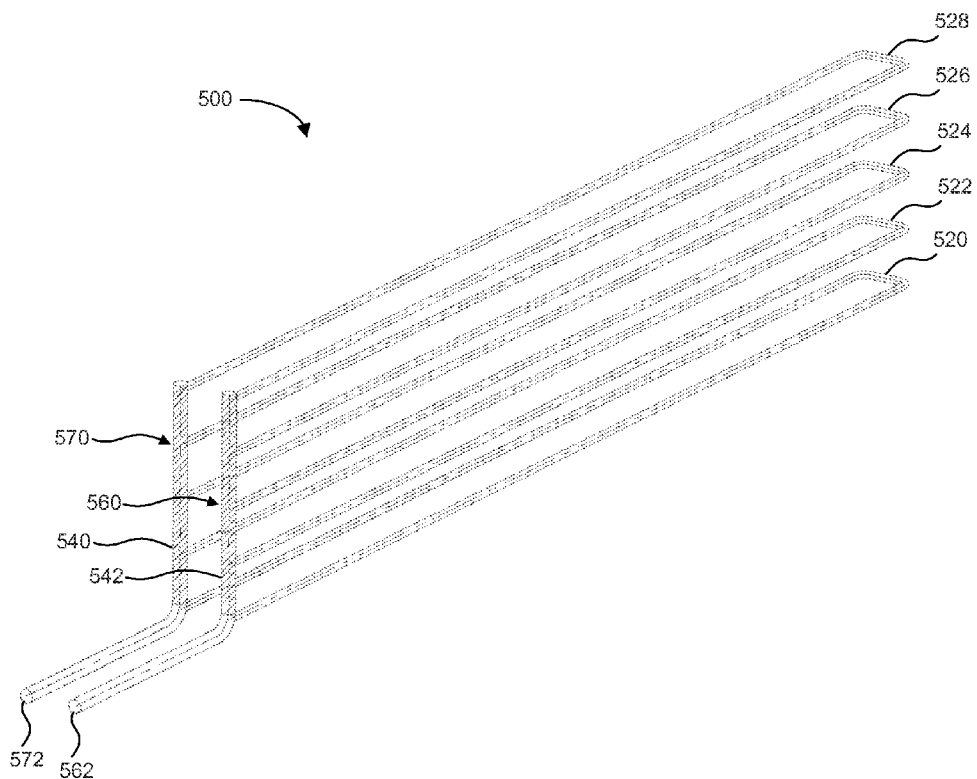
FIG. 8 is a vertically compactable fluid transfer device, in accordance with an additional example of the present disclosure.

With reference to FIG. 8, illustrated is a vertically compactable heat transfer device 500, which shows another example of a riser configuration having two riser sections. In this example, as in the example illustrated in FIG. 7, each lateral heat transfer conduit section 520, 522, 524, 526, 528 can be coupled to the two riser sections 540, 542. In this example, however, at least one of the lateral heat transfer conduit sections is configured in an elongate U-shape. Thus, in some cases, the riser sections can be adjacently oriented on a common end of the heat transfer device. The lateral heat transfer conduit sections 520, 522, 524, 526, 528 can be stacked and vertically spaced from one another. Each of the lateral heat transfer conduit sections 520, 522, 524, 526, 528 can therefore be in a cantilevered configuration relative to riser sections 540, 542, which are disposed adjacent one another, although such positioning of the riser sections is optional as the riser sections can be located remote from one another.

In one aspect, a first of the two riser sections, such as riser section 540, can form at least a portion of an inlet manifold 560 that separates inlet heat transfer fluid flow for each of the lateral heat transfer conduit sections 520, 522, 524, 526, 528 coupled to the riser section 540. The inlet manifold 560 can be in fluid communication with an inlet 562 for the heat transfer fluid. The lateral heat transfer conduit sections 520, 522, 524, 526, 528 can form at least a portion of the inlet manifold 560.

In another aspect, a second of the two riser sections, such as riser section 540, forms at least a portion of an outlet manifold 570 that combines outlet heat transfer fluid flow from each of the lateral heat transfer conduit sections 520, 522, 524, 526, 528 coupled to the riser section 542. The outlet manifold 570 can be in fluid communication with an outlet 572 for the heat transfer fluid. The lateral heat transfer conduit sections 520, 522, 524, 526, 528 can form at least a portion of the outlet manifold 570.

As illustrated in FIG. 8, the inlet 562 and the outlet 572 are disposed at a lower portion or bottom of the vertically compactable heat transfer device 500. Thus, in one aspect, the inlet 562 and/or the outlet 572 can be located at least as low as the two riser sections 540, 542, and the lateral heat transfer sections 520, 522, 524, 526, 528, of the device 500. As discussed above with reference to FIG. 6, this configuration can be beneficial for heat transfer characteristics and/or heat transfer fluid flow characteristics of the device 500, such as by taking advantage of convective flow within the device. However, the outlet and/or inlet may be optionally oriented at any position from an upper position above the vertical sections to a lower position.

Figure 9:
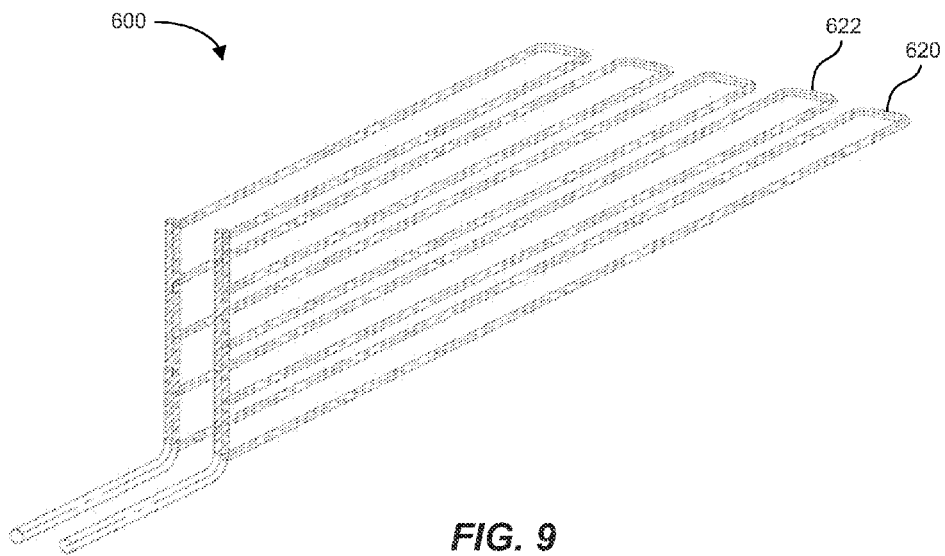
FIG. 9 is a vertically compactable fluid transfer device, in accordance with a further example of the present disclosure.

With reference to FIG. 9, illustrated is a vertically compactable heat transfer device 600, which shows yet another example of a riser configuration having two riser sections. In certain aspects, the lateral heat transfer conduit of a device 600 can include a lateral heat transfer conduit section that is of a different length from another lateral heat transfer conduit section. For example, lateral heat transfer conduit section 620 is longer than lateral heat transfer conduit section 622, such that the elongate U-shape of lateral heat transfer conduit section 620 extends beyond the elongate U-shape of lateral heat transfer conduit section 622. As discussed above relative to FIG. 6, different length lateral heat transfer conduit sections can enable the vertically compactable heat transfer device 600 to fit within and be covered by a side of a particle pile and, in one aspect, approximate an angle of repose for a given pile of particles. Thus, the heat transfer device 600, which can be designed to be disposed within a pile of particles, can be configured to have lateral heat transfer conduit sections that are vertically spaced and laterally terminated to approximate the angle of repose formed by a given pile or grouping of particles.

Figure 10:
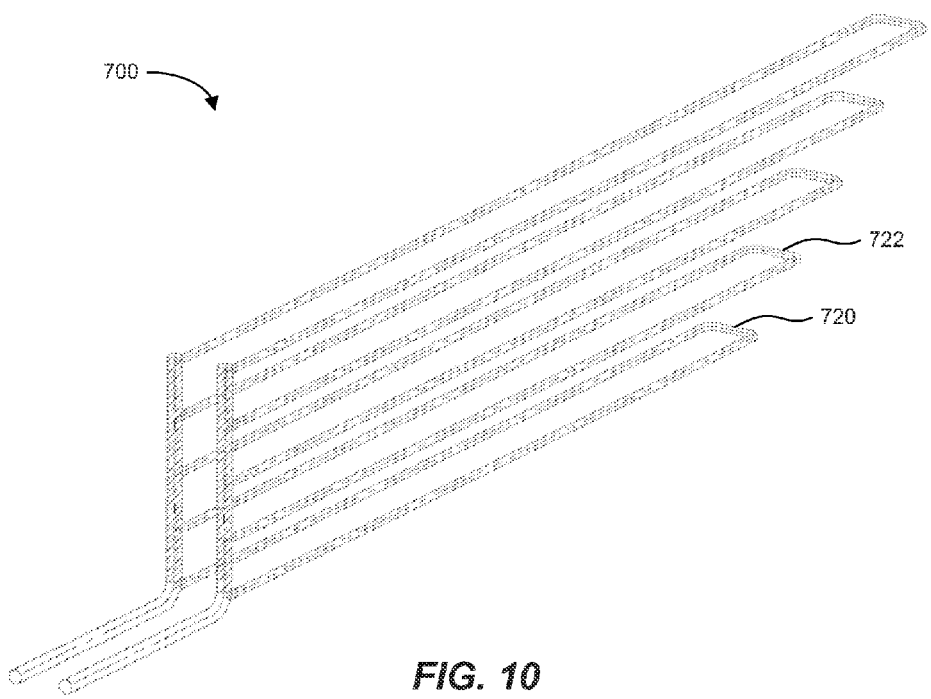
FIG. 10 is a vertically compactable fluid transfer device, in accordance with yet a further example of the present disclosure.

FIG. 10 illustrates another vertically compactable heat transfer device 700, which is also configured to approximate an angle of repose. In this embodiment, however, lateral heat transfer conduit section 722 is longer than lateral heat transfer conduit section 720, such that the elongate U-shape of lateral heat transfer conduit section 722 extends beyond the elongate U-shape of lateral heat transfer conduit section 720. In some cases, a pile or grouping of particles in which a vertically compactable heat transfer device is disposed can be contained within an impoundment formed substantially from earthen materials. The impoundment can be constructed from a pile or series of piles of earthen materials having an angle of repose. The grouping of particles in which the vertically compactable heat transfer device is disposed can fill the impoundment, with sides thus having a form of a supplementary angle to the angle of repose of the earthen materials forming the impoundment.

The different length lateral heat transfer conduit sections can therefore enable the vertically compactable heat transfer device 700 to fit within and be covered by a side of a particle pile and, in one aspect, approximate an angle of repose for the impoundment in which the particles are disposed. Thus, the heat transfer device 700, which can be designed to be disposed within a pile of particles, can be configured to have lateral heat transfer conduit sections that are vertically spaced and laterally terminated to approximate the angle of repose formed by a given pile or grouping of earthen materials that form an impoundment for the pile of particles.

Additional configurations of vertically compactable heat transfer devices can include multiple extended risers such that the risers comprise the majority of the heat transfer surfaces. For example, U-shaped segments can be oriented vertically rather than horizontally (as shown in FIGS. 6 and 8-10).

Figure 11:
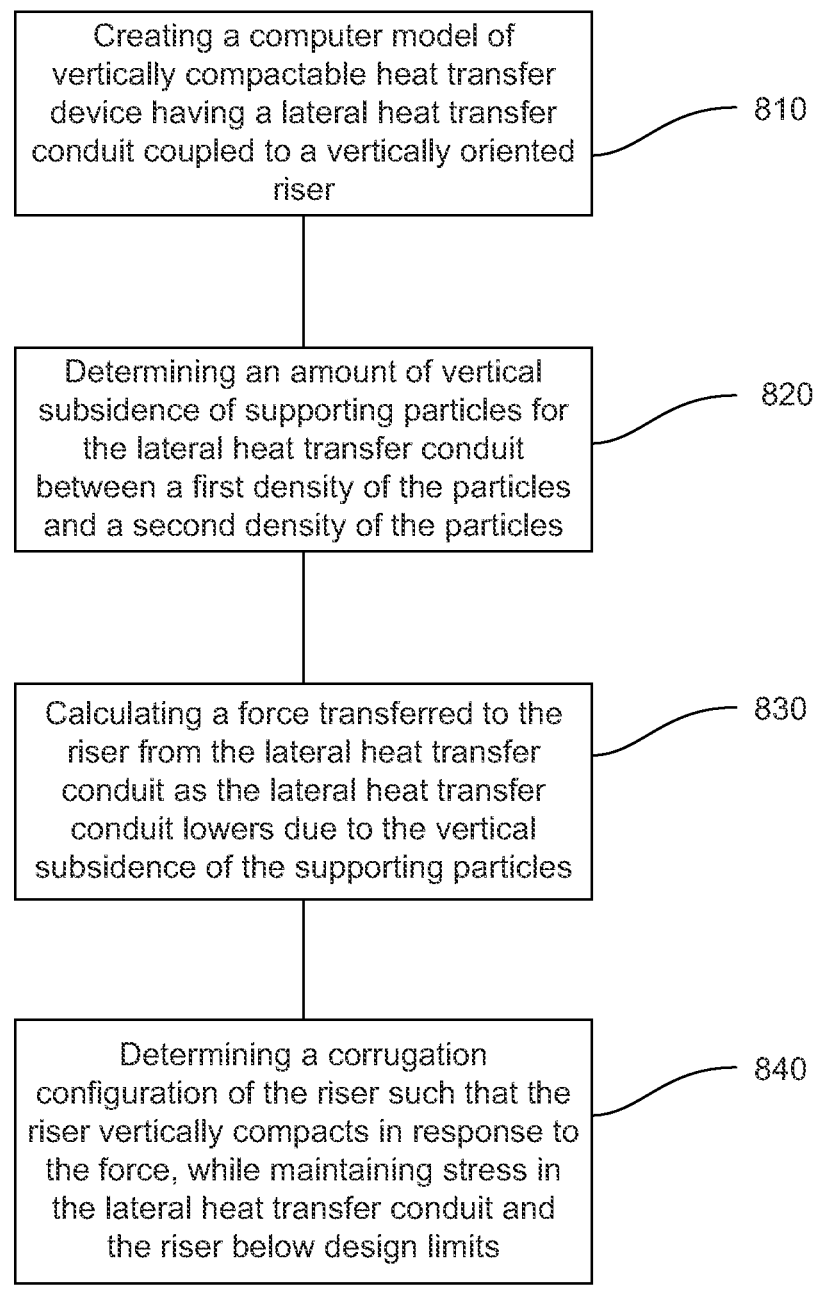
FIG. 11 is a block diagram illustrating use of a computer model to optimize a design of a fluid transfer device, in accordance with an example of the present disclosure.

With reference to FIG. 11, illustrated is a block diagram illustrating use of a computer model to optimize a design of a heat transfer device. For example, a method of designing a vertically compactable heat transfer device can comprise creating a computer model of vertically compactable heat transfer device having a lateral heat transfer conduit coupled to a vertically oriented riser 810. The method can also comprise determining an amount of vertical subsidence of supporting particles for the lateral heat transfer conduit between a first density of the particles and a second density of the particles 820. The method can further comprise calculating a force transferred to the riser from the lateral heat transfer conduit as the lateral heat transfer conduit lowers due to the vertical subsidence of the supporting particles 830. Additionally, the method can comprise determining a corrugation configuration of the riser such that the riser vertically compacts in response to the force, while maintaining stress in the lateral heat transfer conduit and the riser below design limits 840. It is noted that no specific order is required in this method, though generally in one embodiment, these method steps can be carried out sequentially.

The foregoing detailed description describes the invention with reference to specific exemplary embodiments. However, it will be appreciated that various modifications and changes can be made without departing from the scope of the present invention as set forth in the appended claims. The detailed description and accompanying drawings are to be regarded as merely illustrative, rather than as restrictive, and all such modifications or changes, if any, are intended to fall within the scope of the present invention as described and set forth herein.

More specifically, while illustrative exemplary embodiments of the invention have been described herein, the present invention is not limited to these embodiments, but includes any and all embodiments having modifications, omissions, combinations (e.g., of aspects across various embodiments), adaptations and/or alterations as would be appreciated by those skilled in the art based on the foregoing detailed description. The limitations in the claims are to be interpreted broadly based on the language employed in the claims and not limited to examples described in the foregoing detailed description or during the prosecution of the application, which examples are to be construed as non-exclusive. Any steps recited in any method or process claims may be executed in any order and are not limited to the order presented in the claims. Accordingly, the scope of the invention should be determined solely by the appended claims and their legal equivalents, rather than by the descriptions and examples given above.

What is claimed is:

1. A vertically compactable fluid transfer device, comprising:
    a lateral fluid transfer conduit to convey a fluid therethrough and to be supported by particles packed to a first density; and
    a riser coupled to, and in fluid communication with, the lateral fluid transfer conduit, wherein the riser is capable of compacting vertically by at least 20% while maintaining structural integrity when the lateral fluid transfer conduit lowers as the supporting particles pack to a second density, which is higher than the first density.

2. The fluid transfer device of claim 1, wherein the riser is substantially vertical.

3. The fluid transfer device of claim 1, further comprising particles packed to the first density.

4. The fluid transfer device of claim 3, wherein the particles comprise oil shale.

5. The fluid transfer device of claim 1, wherein the riser is capable of maintaining structural integrity when vertically compacted by at least 40%.

6. The fluid transfer device of claim 1, wherein the riser comprises a corrugated portion to compact vertically while maintaining structural integrity.

7. The fluid transfer device of claim 1, wherein the riser comprises a plurality of riser sections and the lateral fluid transfer conduit comprises a plurality of lateral fluid transfer conduit sections, the riser sections and lateral fluid transfer conduit sections being alternately coupled to one another in a vertically oriented serpentine arrangement.

8. The fluid transfer device of claim 7, wherein the plurality of riser sections and the plurality of lateral fluid transfer conduit sections are in fluid communication with an inlet manifold that separates inlet fluid flow into at least two flow paths.

9. The fluid transfer device of claim 8, wherein the lateral fluid transfer conduit forms at least a portion of the inlet manifold.

10. The fluid transfer device of claim 7, wherein the plurality of riser sections and the plurality of lateral fluid transfer conduit sections are in fluid communication with an outlet manifold that combines outlet fluid flow from at least two flow paths.

11. The fluid transfer device of claim 10, wherein the riser forms at least a portion of the outlet manifold.

12. The fluid transfer device of claim 7, further comprising an inlet and an outlet in fluid communication with the plurality of riser sections and the plurality of lateral fluid transfer conduit sections, wherein the inlet and the outlet are located at least as low as the plurality of riser sections and the plurality of lateral fluid transfer conduit sections.

13. The fluid transfer device of claim 1, wherein the riser consists of an inlet riser and an outlet riser which are oriented on a common end of the device.

14. The fluid transfer device of claim 1, wherein the riser comprises two riser sections and the lateral fluid transfer conduit comprises a plurality of lateral fluid transfer conduit sections, each lateral fluid transfer conduit section being coupled to the two riser sections.

15. The fluid transfer device of claim 14, wherein the two riser sections are substantially vertical.

16. The fluid transfer device of claim 14, wherein a first of the two riser sections forms at least a portion of an inlet manifold that separates inlet fluid flow for each of the plurality of lateral fluid transfer conduit sections.

17. The fluid transfer device of claim 14, wherein a second of the two riser sections forms at least a portion of an outlet manifold that combines outlet fluid flow from each of the plurality of lateral fluid transfer conduit sections.

18. The fluid transfer device of claim 14, further comprising an inlet and an outlet in fluid communication with the two riser sections and the plurality of lateral fluid transfer conduit sections, wherein the inlet and the outlet are located at least as low as the two riser sections and the plurality of lateral fluid transfer conduit sections.

19. The fluid transfer device of claim 14, wherein the two riser sections are coupled to one of the plurality of lateral fluid transfer conduit sections at opposite ends from one another.

20. The fluid transfer device of claim 14, wherein at least one of the plurality of lateral fluid transfer conduit sections is configured in an elongate U-shape.

21. The fluid transfer device of claim 14, wherein at least two of the plurality of lateral fluid transfer conduit sections have different lengths.

22. A method of designing a vertically compactable fluid transfer device, comprising:
    creating a computer model of vertically compactable fluid transfer device having a lateral fluid transfer conduit coupled to a vertically oriented riser;
    determining an amount of vertical subsidence of supporting particles for the lateral fluid transfer conduit between a first density of the particles and a second density of the particles;
    calculating a force transferred to the riser from the lateral fluid transfer conduit as the lateral fluid transfer conduit lowers due to the vertical subsidence of the supporting particles; and determining a corrugation configuration of the riser such that the riser vertically compacts in response to the force, while maintaining stress in the lateral fluid transfer conduit and the riser below design limits.

* * * * *